(12) United States Patent
Fukui et al.

(10) Patent No.: US 8,696,813 B2
(45) Date of Patent: Apr. 15, 2014

(54) METHOD OF MANUFACTURING SILICON SINGLE CRYSTAL, APPARATUS FOR PULLING SILICON SINGLE CRYSTAL AND VITREOUS SILICA CRUCIBLE

(75) Inventors: Masanori Fukui, Akita (JP); Hideki Watanabe, Tokyo (JP); Nobumitsu Takase, Tokyo (JP)

(73) Assignee: Japan Super Quartz Corporation, Akita (JP)

( * ) Notice: Subject to any disclaimer, the term of this patent is extended or adjusted under 35 U.S.C. 154(b) by 993 days.

(21) Appl. No.: 12/786,911

(22) Filed: May 25, 2010

(65) Prior Publication Data

US 2010/0326349 A1    Dec. 30, 2010

(30) Foreign Application Priority Data

May 27, 2009    (JP) .................................. 2009-128291

(51) Int. Cl.
*C30B 15/04*    (2006.01)
(52) U.S. Cl.
USPC ............... 117/200; 117/201; 117/13; 117/17; 117/30
(58) Field of Classification Search
USPC ................................ 117/200, 201, 17, 13, 30
See application file for complete search history.

(56) References Cited

U.S. PATENT DOCUMENTS

| | | | |
|---|---|---|---|
| 4,019,645 | A | 4/1977 | Seiler et al. |
| 6,228,165 | B1 | 5/2001 | Baba et al. |
| 6,565,651 | B2 | 5/2003 | Dietze et al. |
| 2001/0007240 | A1 | 7/2001 | Dietze et al. |
| 2002/0020340 | A1 | 2/2002 | Dietze et al. |
| 2007/0261632 | A1 | 11/2007 | Suzuki et al. |
| 2010/0107965 | A1 | 5/2010 | Fukui et al. |
| 2010/0111802 | A1 | 5/2010 | Umeno et al. |

(Continued)

FOREIGN PATENT DOCUMENTS

| | | |
|---|---|---|
| DE | 959479 | 3/1957 |
| EP | 0463543 | 1/1992 |

(Continued)

OTHER PUBLICATIONS

Extended European Search Report dated Jan. 28, 2011.

(Continued)

*Primary Examiner* — Bob M Kunemund
(74) *Attorney, Agent, or Firm* — Greenblum & Bernstein, P.L.C.

(57) ABSTRACT

Leakage of silicon melt is monitored and touch of a seed crystal at the silicon melt is detected, and in addition, reinforcement of a vitreous silica crucible to be endurable during pulling for a long time and decrease of impurity concentration of a silicon single crystal can be expected. A method for manufacturing a silicon single crystal is provided. The method includes: detecting touching status of a seed crystal at silicon melt by supplying voltage V1 using a crucible side as a negative electrode and a wire side as a positive electrode and by monitoring change of the voltage, when the seed crystal provided at a front end of the wire touches the silicon melt inside a vitreous silica crucible; devitrifying an inner surface of the vitreous silica crucible as supplying voltage V2 using the crucible side as a positive electrode and the wire side as a negative electrode during a temperature control period; and growing a silicon single crystal by slowly pulling the seed crystal as supplying voltage V3 using the crucible side as a negative electrode and the wire side as a positive electrode after the temperature control period.

17 Claims, 4 Drawing Sheets

(56) References Cited

U.S. PATENT DOCUMENTS

| | | |
|---|---|---|
| 2010/0126408 A1* | 5/2010 | Miyahara et al. ............... 117/29 |
| 2010/0162944 A1 | 7/2010 | Azuma et al. |
| 2010/0175611 A1 | 7/2010 | Takanashi |
| 2010/0251959 A1* | 10/2010 | Kodama et al. ............... 117/208 |

FOREIGN PATENT DOCUMENTS

| | | |
|---|---|---|
| EP | 1241141 | 9/2002 |
| EP | 1329539 | 7/2003 |
| JP | 62-275087 | 11/1987 |
| JP | 6-271387 | 9/1994 |
| JP | 11-180794 | 7/1999 |
| JP | 2003-12393 | 1/2003 |
| JP | 2003-505335 | 2/2003 |
| JP | 03622468 | 2/2005 |
| JP | 2005-162549 | 6/2005 |
| JP | 2006-036568 | 2/2006 |
| JP | 2006-36568 | 2/2006 |
| JP | 2007-277024 | 10/2007 |
| JP | 2008-254949 | 10/2008 |

OTHER PUBLICATIONS

Extended European Search Report dated Mar. 23, 2011.
Search report from Singapore, mail date is Aug. 19, 2011.

* cited by examiner

METHOD OF MANUFACTURING SILICON SINGLE CRYSTAL, APPARATUS FOR PULLING SILICON SINGLE CRYSTAL AND VITREOUS SILICA CRUCIBLE

CROSS-REFERENCE TO RELATED APPLICATION

This application claims priority to Japanese Patent Application No. 2009-128291 filed on May 27, 2009 and all the benefits accruing therefrom under 35 U.S.C. §119, the contents of which are incorporated by reference in their entirety.

BACKGROUND

The present invention relates to a method of manufacturing a silicon single crystal and an apparatus for pulling a silicon single crystal, and more particularly, to a method for supplying a voltage to detect leakage of a silicon melt or touch of a seed crystal at the silicon melt. Also, the present invention relates to a vitreous silica crucible, which employs the method for supplying a voltage and is used for pulling a silicon single crystal.

As one of manufacturing methods of a silicon single crystal for semiconductor devices, Czochralski method (CZ method, hereinafter) is well known. In CZ method, a seed crystal is dipped into a silicon melt obtained by melting silicon raw material in a vitreous silica crucible, and a silicon single crystal grows by gradually pulling up the seed crystal while rotating the crucible and the seed crystal relatively to each other. To manufacture a high-purity silicon single crystal for semiconductor devices, it is required that the silicon single crystal should not be contaminated due to dissolution of impurities contained in the vitreous silica crucible, and the vitreous silica crucible should also have a heat resistance enough to be endurable during pulling for a long time.

Also, in the manufacturing of silicon single crystals, it is an important issue to secure the safety during work for a long time. For example, in Patent Document 1, a method of detecting leakage of a silicon melt in a silicon single crystal pulling apparatus is disclosed. This technique is, in an apparatus having a conductive supporting means supporting a vitreous silica crucible and a conductive suspender suspending a seed crystal, to detect leakage of a silicon melt by supplying a constant voltage between the supporting means and the suspender and by detecting change in the electric current flowing between the supporting means and the suspender. Also, in patent document 2, disclosed is a technique in which movement of impurities inside the crucible is suppressed to thereby prevent deformation of the crucible or dissolution of impurities from the inside of the crucible by intermittently supplying a voltage for testing leakage of a melt.

Further, in patent document 3, disclosed is a technique in which during the time from touch of a seed crystal at a silicon melt to at least formation of a crystal trunk portion, a voltage supplied to a pulling shaft of the seed crystal is kept at a level of −50 V to +50 V (0 V being excluded). Furthermore, in patent document 4, disclosed is a method in which an electric field, e.g., a constant electric field or a periodic pulse wave is supplied to a vitreous crucible filled with silicon melt so as to decrease or prevent deterioration of an inner surface of the quartz crucible.

Moreover, in patent document 5, disclosed is a method in which alkali metal ions are contained in a vitreous crucible and are concentrated near an inner wall surface of the vitreous crucible to efficiently devitrify the inner wall surface of the crucible by supplying a direct current voltage using an outer wall side as a positive electrode and the inner wall side as a negative electrode between the inner wall and the outer wall of the vitreous crucible. Also, in patent document 6, disclosed is a method in which the amount of alkali metal ions introduced into a silicon single crystal becomes uniform by making a current flowing through the silicon single crystal constant during pulling of the silicon single crystal.

PATENT DOCUMENTS

[Patent Document 1] Japanese Patent Application Laid-Open No. 1987-275087
[Patent Document 2] Japanese Patent Application Laid-Open No. 1999-180794
[Patent Document 3] Japanese Patent Application Laid-Open No. 2003-12393
[Patent Document 4] Japanese Patent Application Laid-Open No. 2003-505335
[Patent Document 5] Japanese Patent Application Laid-Open No. 2006-36568
[Patent Document 6] Japanese Patent Application Laid-Open No. 2008-254949

As aforementioned, when a voltage using the outer wall side of the crucible as a positive electrode and the inner wall side as a negative electrode is supplied, since alkali metal ions in the vitreous silica are attracted toward the inner surface side of the crucible, the alkali metal ions can be concentrated near the inner surface to thereby efficiently devitrify the inner surface of the crucible.

However, in a case where a voltage is supplied using a supporting shaft side of the crucible as a positive electrode and a pulling shaft side as a negative electrode in order to supply a voltage using the outer wall side of the crucible as a positive electrode and the inner wall side as a negative electrode, since alkali metal ions in the silicon melt are attracted toward silicon single crystal, the silicon single crystal may be easily contaminated and a high quality silicon single crystal cannot be manufactured. Owing to this, there is required a method of suppressing contamination of silicon single crystal and expecting devitrification of the inner surface of the crucible while supplying a voltage for monitoring of melt leakage and inspecting touch of a seed crystal at the silicon melt.

SUMMARY

The present disclosure provides a method of manufacturing a silicon single crystal, capable of monitoring leakage of silicon melt; detecting touch of a seed crystal at the silicon melt; and expecting reinforcement of a vitreous silica crucible to be endurable during pulling for a long time and decrease of impurity concentration of a silicon single crystal. The present disclosure also provides an apparatus for pulling a silicon single crystal for realizing the manufacturing method. The present disclosure also provides a vitreous silica crucible preferably used in a method of manufacturing a silicon single crystal, which pulls the silicon single crystal while supplying a voltage to the crucible.

In accordance with exemplary embodiments, a method of manufacturing a silicon single crystal includes: detecting touching status of a seed crystal at silicon melt by supplying a first voltage using a vitreous silica crucible side as a negative electrode and a pulling shaft side as a positive electrode and by monitoring change of the first voltage, when the seed crystal provided at a front end of the pulling shaft touches the silicon melt inside a vitreous silica crucible; devitrifying an inner surface of the vitreous silica crucible as supplying a second voltage greater than the first voltage using the vitreous silica crucible side as a positive electrode and the pulling shaft side as a negative electrode during a temperature control period of the silicon melt, the temperature control period being a certain period after the touch of the seed crystal at the silicon melt; and growing a silicon single crystal by slowly pulling the seed crystal as supplying a third voltage smaller than the second voltage using the vitreous silica crucible side as a negative electrode and the pulling shaft side as a positive electrode after completion of the temperature control period.

In accordance with exemplary embodiments, an apparatus for pulling a silicon single crystal includes: a pulling shaft; an elevator unit of the pulling shaft; a seed crystal provided at a front end of the pulling shaft; a vitreous silica crucible filled with silicon melt; a heater heating the silicon melt inside the vitreous silica crucible; a power supply supplying a voltage between the vitreous silica crucible and the pulling shaft; and a controller controlling the elevator unit, the heater and the power supply. The controller includes: a touch control part detecting touching status of the seed crystal at the silicon melt by supplying a first voltage using the vitreous silica crucible side as a negative electrode and the pulling shaft side as a positive electrode and by monitoring change of the first voltage, when the seed crystal touches at the silicon melt by lowering the pulling shaft; a devitrification control part devitrifying inner surface of the vitreous silica crucible as supplying a second voltage greater than the first voltage using the vitreous silica crucible side as a positive electrode and the pulling shaft as a negative electrode during a temperature control period of the silicon melt, the temperature control period being a certain period after the touch of the seed crystal at the silicon melt; and a single crystal control part growing a silicon single crystal by slowly pulling the seed crystal as supplying a third voltage smaller than the second voltage using the vitreous silica crucible side as a negative electrode and the pulling shaft side as a positive electrode after completion of the temperature control period.

In accordance with exemplary embodiments, it becomes possible to move alkali metal ions to near the inner surface of the crucible by supplying a DC voltage using the vitreous silica crucible side as a positive electrode and the pulling shaft side as a negative electrode for a certain period after a silicon raw material is melted. The term "certain period" represents a time necessary for controlling temperature of the silicon melt and heating the seed crystal, and is about 3-6 hours. Because the pulling of the silicon single crystal is not performed immediately after the silicon raw material in the crucible is completely melted but is performed after the certain temperature control period, the certain temperature control period can be used for the devitrification of the inner surface of the crucible, and thereby durability of the crucible can be efficiently enhanced. Also, after the elapse of the temperature control period, by inverting the polarity of the voltage, alkali metal ions in the silicon melt are attracted toward the crucible and are separated from the silicon single crystal that is being pulled. Accordingly, the impurity concentration in the silicon single crystal can be decreased. That is, both of improvement of the durability of the crucible and enhancement in the purity of the silicon single crystal can be expected, and a method of manufacturing a silicon single crystal that is superior compared with the conventional manufacturing method can be provided.

In accordance with exemplary embodiments, the growing of the silicon single crystal may further include reproducing a devitrified portion of the inner surface of the vitreous silica crucible by supplying a fourth voltage greater than a third voltage for a certain period before the devitrified portion formed at the inner surface of the vitreous silica crucible disappears, and the supplying of the third voltage and the supplying of the fourth voltage may be alternately repeated.

In accordance with exemplary embodiments, under the circumstance in which a loss-by-melting rate in a depth direction of the crucible is greater than a devitrification rate, before a uniform devitrification of the inner surface of the crucible disappears, the devitrification may be reaccelerated by returning to the condition in which the voltage is supplied using the crucible side as a positive electrode, and thereby a devitrified surface can be always secured during the pulling for a long time. Accordingly, the durability of the crucible can be remarkably enhanced and thus enhancement in the single crystallization rate can be further expected.

In accordance with exemplary embodiments, the leakage of silicon melt may be detected by monitoring changes of the first to third voltages. In accordance with exemplary embodiments, although the polarity or level of the supplied voltage is changed, the voltage is continuously supplied. Therefore, the leakage of melt can be surely detected by monitoring the change of the voltage.

In accordance with exemplary embodiments, the vitreous silica crucible may include one or at least two alkali metal ions selected from the group consisting of Na, K and Li, and a sum of concentrations of the alkali metal ions may be in a range of 0.05 ppm to 5 ppm. In accordance with exemplary embodiments, comparatively large amount of alkali ions are included in the vitreous silica glass, so that a uniform devitrified surface can be efficiently formed when devitrifying the inner surface of the crucible.

In accordance with exemplary embodiments, a vitreous silica crucible has a cylindrical sidewall part, a bottom part provided at a lower portion of the sidewall part, and a joining section provided between the sidewall part and the bottom part, and is used for pulling silicon single crystals in a state where a predetermined voltage is supplied with respect to a thickness direction of the crucible. The vitreous silica crucible includes: a transparent vitreous silica layer provided on an inner surface of the crucible; and an opaque vitreous silica layer provided on an outer surface of the crucible and including a plurality of bubbles. The opaque vitreous silica layer includes one or at least two alkali metals selected from the group consisting of Na, K and Li, and a sum of concentrations of the alkali metals may be equal to or greater than 0.05 ppm. In this case, a sum of concentrations of the alkali metals included in the opaque vitreous silica layer may be equal to or greater than 0.2 ppm. Also, the transparent vitreous silica layer includes one or at least two alkali metals selected from the group consisting of Na, K and Li, and a sum of concentrations of the alkali metals may be equal to or greater than 0.05 ppm and be equal to or less than 5 ppm.

In accordance with exemplary embodiments, a vitreous silica crucible for pulling a silicon single crystal includes relatively many alkali metals, and the alkali metals may efficiently function as a devitrification accelerator when a voltage is supplied, thereby effectively devitrifying the inner surface or outer surface of the vitreous silica crucible. Accordingly, dissolution of the alkali metal impurities into the silicon melt can be suppressed to enhance the strength of the crucible.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Hereinafter, exemplary embodiments will be described in detail with reference to the accompanying drawings.

Figure 1:
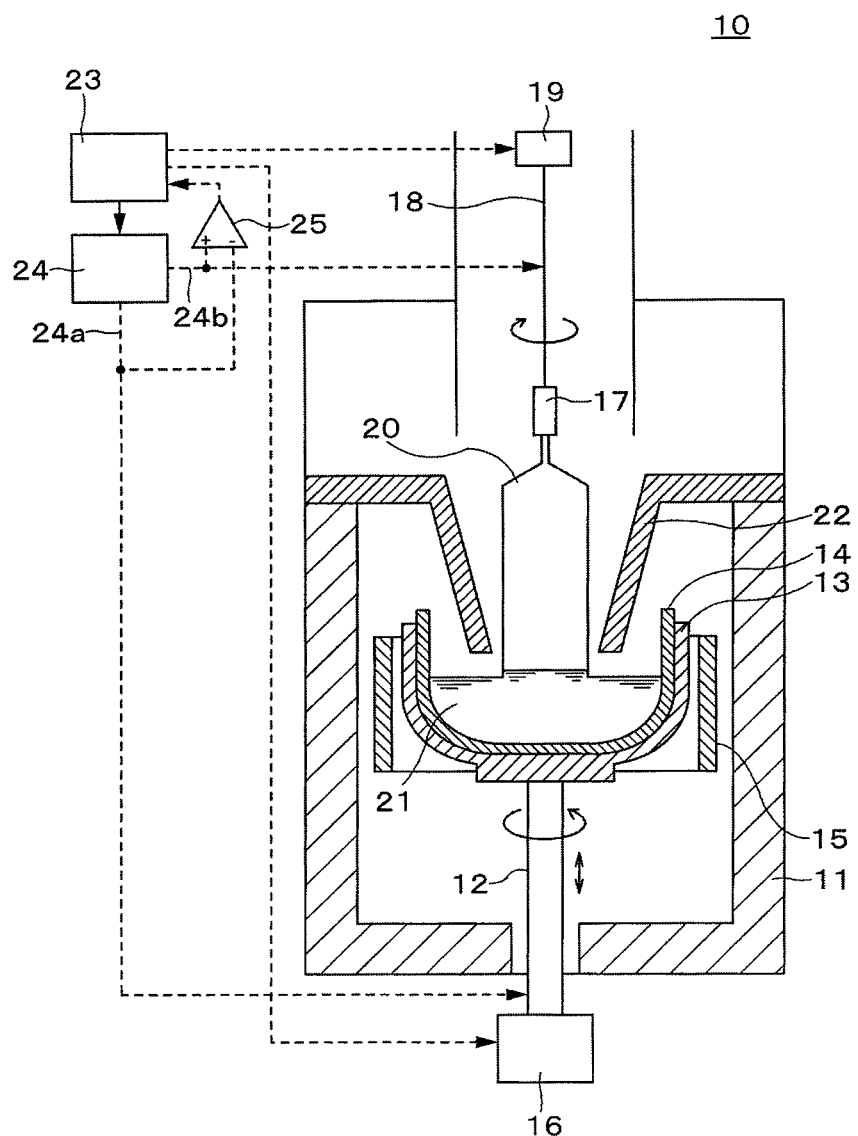
FIG. 1 is a cross sectional view schematically illustrating a configuration of an apparatus 10 for pulling a silicon single crystal in accordance with an exemplary embodiment.

FIG. 1 is a cross sectional view schematically illustrating a configuration of an apparatus 10 for pulling a silicon single crystal in accordance with an exemplary embodiment.

As illustrated in FIG. 1, an apparatus 10 for pulling a silicon single crystal includes a chamber 11, a conductive supporting shaft 12 penetrating a center of a bottom part of the chamber 11 and installed in a vertical direction, a graphite susceptor 13 fixed on a top end portion of the supporting shaft 12, a vitreous silica crucible 10 received in the graphite susceptor 13, a heater 15 installed around the graphite susceptor 13, a supporting shaft driver 16 for raising and rotating the supporting shaft 12, a seed chuck 17 supporting a seed crystal, a pulling wire 18 (pulling shaft) suspending the seed chuck 17, a wire winder 19 for winding and releasing the wire 18, a heat shielding member 22 for preventing a silicon single crystal 20 from being heated by radiant heat from the heater 15 and the vitreous silica crucible 14 and for suppressing temperature change of a silicon melt 21, and a controller 23 controlling each element of the apparatus 10.

Also, the apparatus 10 includes a power supply 24 for supplying a DC voltage between the supporting shaft 12 and the wire 18. One terminal 24a of the power supply 24 is connected to the supporting shaft 12 and the other terminal 24b is connected to the wire 18. By supplying a voltage between the supporting shaft 12 and the wire 18 by the power supply 24, leakage of the silicon melt is monitored and touch of the seed crystal at the silicon melt is inspected. The polarity and level of the voltage are determined by instructions of the controller 23. The voltage between the supporting shaft 12 and the wire 18 is supplied to the controller 23 through a comparator 25, and is monitored by the controller 23.

Figure 2:
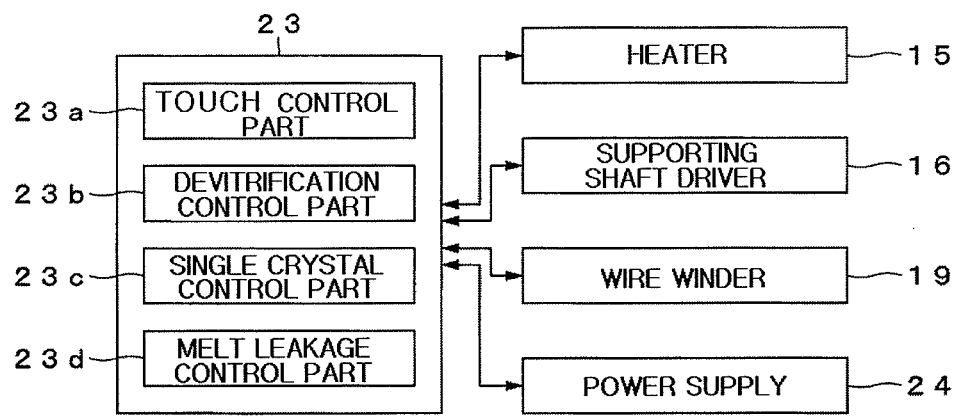
FIG. 2 is a functional block diagram of a controller 23.

FIG. 2 is a functional block diagram of the controller 23.

As illustrated in FIG. 2, the controller 23 includes a touch control part 23a controlling touch of the seed crystal at the silicon melt, a devitrification control part 23b controlling devitrification of an inner surface of the crucible, a single crystal control part 23c controlling pulling of the silicon single crystal 20, and a melt leakage monitoring part 23d monitoring leakage of the silicon melt 21. These respective functional blocks are realized by cooperation of hardwares such as a CPU, a memory, etc. constituting the controller 23 with a control program stored in the memory.

Herein, the touch control part 23a controls the wire winder 19 and the power supply 24 such that the seed crystal touches the silicon melt 21 by lowering the wire 18, a voltage V1 is supplied between the supporting shaft 12 and the wire 18 to monitor change of the voltage, and whether the seed crystal touches the silicon melt 21 is detected. The devitrification control part 23b controls the heater 15 and the power supply 24 such that a voltage V2 is supplied between the supporting shaft 12 and the wire 18 to devitrify an inner surface of the vitreous silica crucible during a temperature control period that is a certain period from the touch of the seed crystal at the silicon melt. The single crystal control part 23c controls the heater 15, the wire winder 19, and the power supply 24 such that the seed crystal is slowly pulled to grow a silicon single crystal by supplying a voltage V3 after the temperature control period. The melt leakage monitoring part 23d monitors the voltages V1 to V3 supplied during the period from the detection of touch at the silicon melt to the completion of pulling of the silicon single crystal, and detects melt leakage from change of the voltages.

Although various types of crucibles such as a crucible using only natural quartz as a raw material, a high purity vitreous silica crucible having a synthetic fused silica layer formed on an inner surface thereof and so forth are used as the vitreous silica crucible 14, the vitreous silica crucible 14 in accordance with this exemplary embodiment may contain one or at least two alkali metal ions selected from the group consisting of Na, K and Li, and preferably may contain natural quartz as a raw material. In this type of crucible, because the alkali metal ions in the vitreous silica are concentrated near the inner surface of the crucible by supplying a voltage using the inner surface of the crucible as a negative electrode and an outer surface of the crucible as a positive electrode, it is possible to efficiently devitrify (i.e., crystallize) the inner surface of the crucible using the alkali metal as a reference point. It is also possible to efficiently devitrify the outer surface of the crucible by supplying a voltage using the outer surface of the crucible as a negative electrode and the inner surface of the crucible as a positive electrode.

Among alkali metal ions Na, K and Li, a sum of concentrations of one or at least two alkali metal ions included in the vitreous silica crucible 14 may be equal to or greater than 0.5 ppm and equal to or less than 5 ppm. Preferably, it may be equal to or greater than 0.2 ppm and equal to or less than 2 ppm. If the content of the alkali metal ions is too small, the alkali metal ions cannot be concentrated near the inner surface of the vitreous silica crucible, and the inner surface or outer surface of the vitreous silica crucible cannot be uniformly devitrified. Meanwhile, if the content of the alkali metal ions is too much, large amount of alkali metal ions in the vitreous silica may be dissolved into the silicon melt to have a bad influence on the quality of the silicon single crystal. In particular, in the case where the sum of concentrations of alkali metal ions is equal to or greater than 0.2 ppm and equal to or less than 2 ppm, it becomes possible to further enhance moving effect of alkali metal ions by supplying a DC voltage, so that a potential difference between the inner surface and the outer surface of the vitreous silica crucible can be decreased and influence of the alkali metal ions contained in the vitreous silica crucible on the quality of the silicon single crystal can be minimized.

The method of manufacturing a silicon single crystal in accordance with the exemplary embodiments is effective in the case of using a large diameter crucible having a diameter of 32 inches (about 800 mm) or more. In the case of melting a large amount of polysilicon in such a large diameter crucible, the effect of the exemplary embodiments of the present invention can appear remarkably, because it takes time for melting and the large diameter crucible needs a high heat resistance to be endurable during pulling for a long time.

Figure 3:
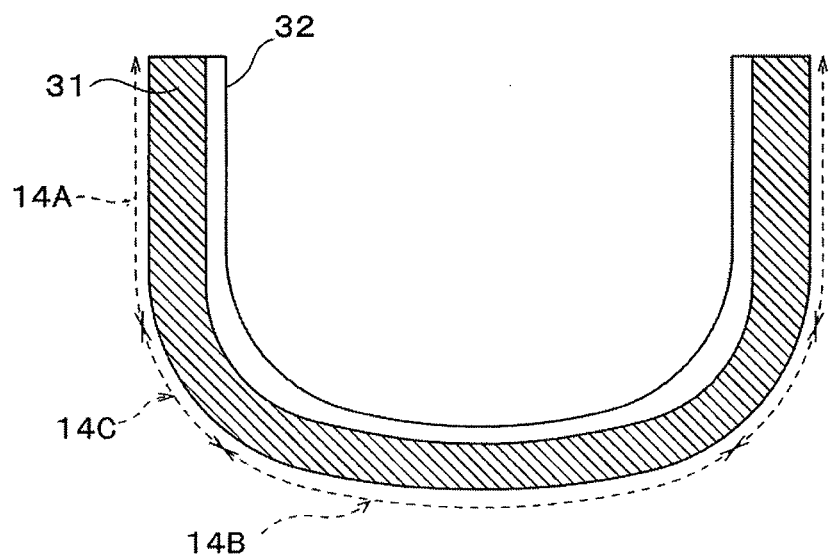
FIG. 3 is a side sectional view illustrating a structure of a vitreous silica crucible 14.

A structure of the vitreous silica crucible 14 will be described in more detail with reference to FIG. 3.

The vitreous silica crucible 14 in accordance with an exemplary embodiment has a sidewall part 14A and a bottom part 14B, and has a basic shape as a container holding the silicon melt. The sidewall part 14A is a cylindrical portion parallel to a central axis (Z-axis) of the crucible 14, and the bottom part 14B of the crucible 14 is a relatively flat portion including an intersecting point with the central axis of the crucible. A joining section 10C where the diameter of the sidewall part 14A decreases gradually is provided between the bottom part 14B and the sidewall part 14A. Although the thickness of the crucible 14 is different depending on its portion, the thickness of the crucible 14 may be 10 mm or more, preferably, 13 mm or more. Typically, a thickness of a large diameter crucible having a diameter of 32 inches (about 800 mm) or more may be 10 mm or more, and a thickness of a large diameter crucible having a diameter of 40 inches (about 1000 mm) or more may be 13 mm or more. Such a large size crucible is used for pulling a silicon single crystal for a long time, and the effect by the exemplary embodiments of the present invention can appear remarkably.

The vitreous silica crucible 14 includes an opaque vitreous silica layer 31 provided at an outer surface side thereof, and a transparent vitreous silica layer 32 provided at an inner surface side thereof.

The opaque vitreous silica layer 31 is an amorphous vitreous silica layer containing a plurality of bubbles. Herein, the term [opaque] means that many bubbles exist in vitreous silica so that the vitreous silica appears white and dim The opaque vitreous silica layer 31 plays a role in uniformly transferring heat generated from the heater disposed around the crucible to the silicon melt in the vitreous silica crucible. The opaque vitreous silica layer 31 may easily control a temperature of the silicon melt due to a higher heat capacity than the transparent vitreous silica layer 32.

A bubble content of the opaque vitreous silica layer 31 is greater than that of the transparent vitreous silica layer 32. A range of the bubble content of the opaque vitreous silica layer 31 enabling required functions to be performed is not specifically limited, however, the bubble content of the opaque vitreous silica layer 31 may be 0.7% or more. This is because, if the bubble content is less than 0.7%, the opaque vitreous silica layer 11 does not perform its function. The bubble content of the opaque vitreous silica layer 31 may be calculated from the specific gravity. Given that the mass of an opaque vitreous silica piece of a unit volume (1 cm$^3$) cut from the crucible is denoted as A, and the specific gravity of vitreous silica not containing a bubble is denoted as B (2.21 g/cm$^3$), the bubble content (P) may be expressed as Equation, $P(\%)=(A/B)\times 100$.

The transparent vitreous silica layer 32 is an amorphous vitreous silica layer which does not contain bubbles substantially. The transparent vitreous silica layer 32 may prevent the increase of quartz pieces which are delaminated from an inner surface of the crucible, and thus may increase single crystallization rate of silicon. Here, the term [transparent vitreous silica layer 32 does not contain bubbles substantially] means the transparent vitreous silica layer 32 has such a bubble content and bubble size that decrease of a single crystallization rate due to the presence of bubbles can be negligible. Although not specifically limited, it can be considered that bubbles are not substantially contained when the bubble content is 0.1% or less and an average bubble diameter is 100 μm or less. A variation of a bubble content from the transparent vitreous silica layer 32 to the opaque vitreous silica layer 31 is relatively abrupt, and therefore, the bubble content reaches that of the opaque vitreous silica layer 31 at a point of approximately 30 μm toward the outer surface of the crucible from a position at which the bubble content of the transparent vitreous silica layer 32 begins to increase. Accordingly, an interface between the opaque vitreous silica layer 31 and the transparent vitreous silica layer 32 is clear and may be easily distinguished with the naked eyes.

The opaque vitreous silica layer 31 includes one or at least two alkali metals selected from the group consisting of Na, K and Li, and a sum of concentrations of the alkali metals may be 0.05 ppm or more, preferably, 0.2 ppm or more. Meanwhile, the transparent vitreous silica layer 32 includes one or at least two alkali metals selected from the group consisting of Na, K and Li, and a sum of concentrations of the alkali metals may be 0.05 ppm or more and 5 ppm or less, and preferably 0.2 ppm or more and 2 ppm or less. As will be described later, the vitreous silica crucible 14 in accordance with the exemplary embodiments of the present invention is used in a state where a voltage is supplied with respect to a thickness direction (or up and down direction) of the crucible. In this state, many alkali metal ions effectively act as a crystallization accelerator uniformly crystallizing a surface of the crucible. This way, although the concentration of alkali metals included in the opaque vitreous silica layer 31 or the transparent vitreous silica layer 32 is higher than that of alkali metal included in the conventional opaque vitreous silica layer or the conventional transparent vitreous silica layer, the vitreous silica crucible can be reinforced without increasing the concentration of alkali metal impurity in the silicon melt. Also, the vitreous silica crucible may be manufactured at low costs because selection range of a raw material of the crucible is wider.

Next, a method of manufacturing a silicon single crystal using the apparatus 10 for pulling a silicon single crystal will be described in detail.

Figure 4:
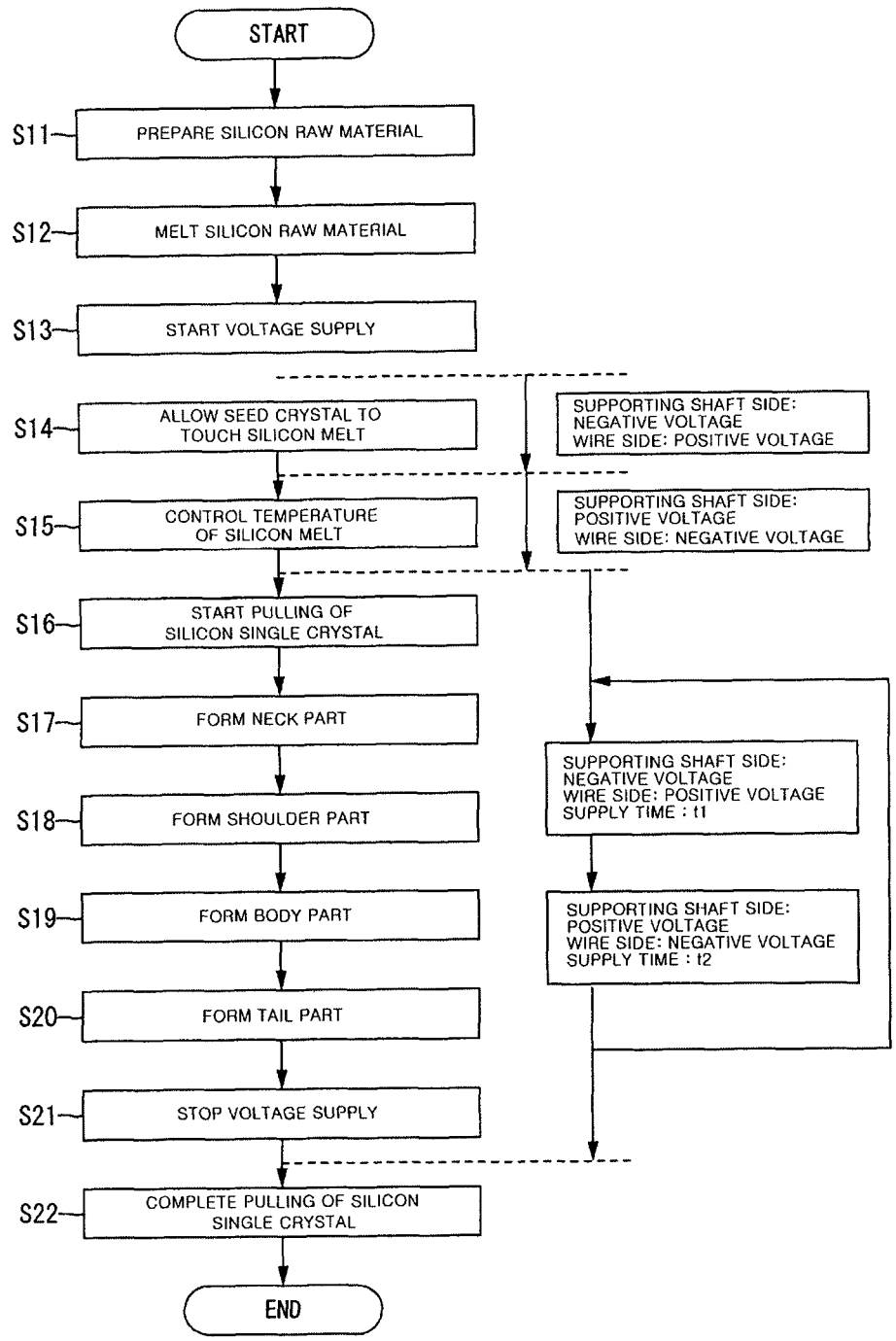
FIG. 4 is a flow chart showing a process of manufacturing a silicon single crystal.
Figure 5:
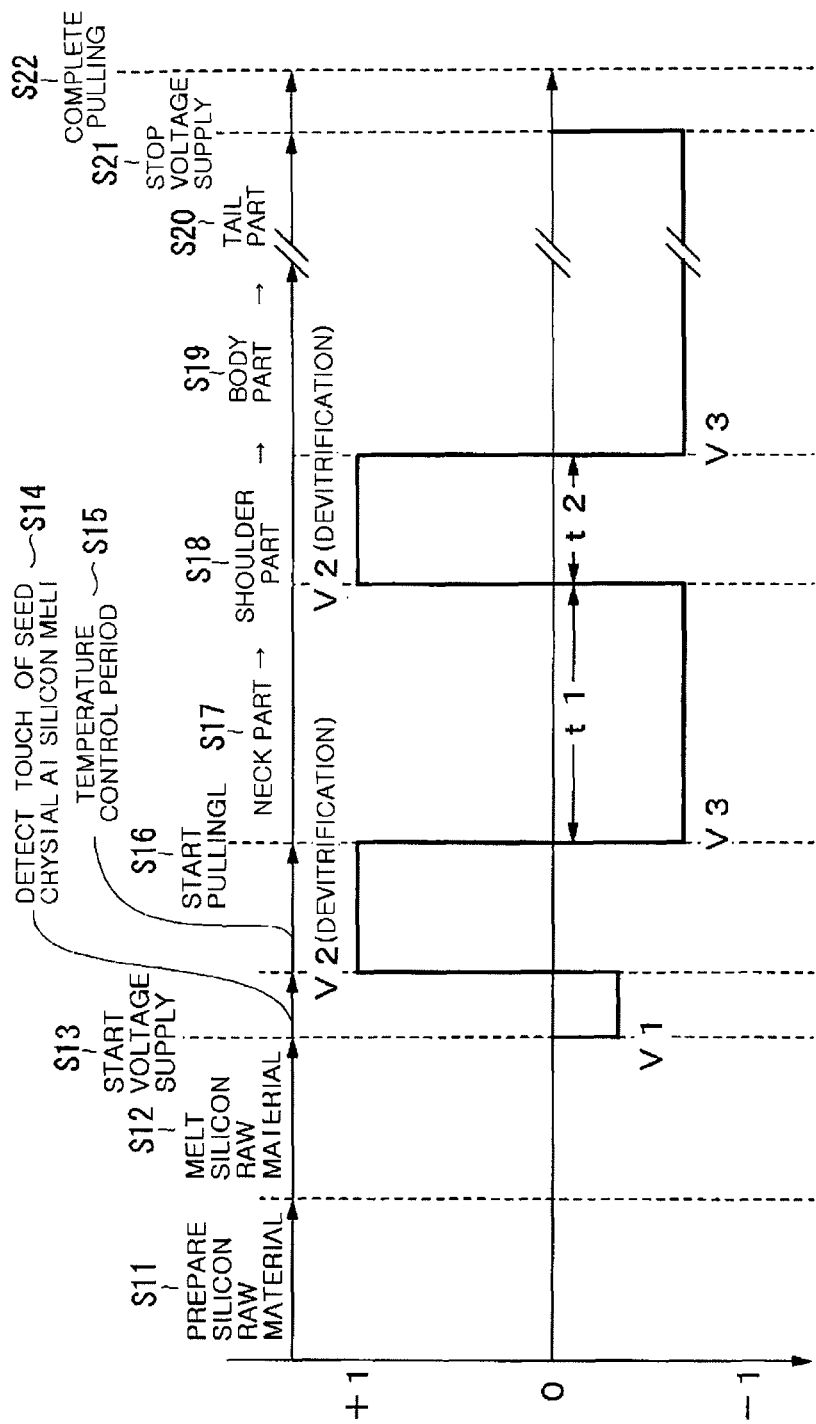
FIG. 5 is a graph showing change of a voltage supplied between a supporting shaft 12 and a wire 18.

FIG. 4 is a flow chart showing a process of manufacturing a silicon single crystal. FIG. 5 is a graph showing change of a voltage supplied between the supporting shaft 12 and the wire 18. Also, FIG. 5 shows voltage levels regulated with respect to a maximum voltage value.

As shown in FIG. 4, in the manufacturing of a silicon single crystal, polysilicon which is a raw material for the silicon single crystal is prepared (Step S11). In more detail, an appropriate amount of polysilicon pieces is filled in the vitreous silica crucible 14 received in the graphite susceptor 13.

Next, after the inside of the chamber 11 is prepared to be under an Ar gas atmosphere at a reduced pressure, the vitreous silica crucible 14 inside the chamber 11 is heated by the heater 15 to melt the polysilicon in the vitreous silica crucible 14 (Step S12). At this time, the seed crystal provided at the front end of the wire 18 is located to be sufficiently higher than the vitreous silica crucible 14 and is spaced apart from the polysilicon which is melting. Also, a voltage is not supplied between the supporting shaft 12 and the wire 18.

Next, a voltage V1 begins to be supplied between the supporting shaft 12 and the wire 18 in order to detect touch of the seed crystal at the silicon melt (Step S13). At this time, the voltage V1 may be at a voltage level of 5 V to 30 V, and the supporting shaft 12 is used as a negative electrode and the wire 18 is used as a positive electrode. In a case where the voltage polarity is inverse to the above case, current may flow due to emission of thermal electrons even though the seed crystal does not touch the silicon melt, and thus touch timing cannot be detected precisely. Whether the seed crystal touches the silicon melt is inspected precisely by lowering the seed chuck 17 to let the seed crystal touch the silicon melt 21 while monitoring the voltage (Step S14).

The vitreous silica crucible 14 is an insulator at room temperature, but has a conductivity at a high temperature of 1000° C. or more. To this end, when a voltage is supplied between the supporting shaft 12 of the vitreous silica crucible 14 and the wire 18 using this property, if the seed crystal is in contact with the silicon melt 21, current flows between the vitreous silica crucible 14 and the wire 18 (On state), whereas if the seed crystal is separated from the silicon melt 21, current does not flow between the vitreous silica crucible 14 and the wire 18 (Off state). Also, a current position of the melt surface is obtained by letting the seed crystal touch the silicon melt 21 and detecting the timing when current begins to flow between the vitreous silica crucible 14 and the wire 18. The obtained current position of the melt surface may be set as an initial position of the melt surface.

Next, the temperature control of the silicon melt is performed to adapt the seed crystal to the silicon melt 21 until the silicon melt 21 is stabilized at about 1500° C. (Step S15). The temperature control period is about 3 hours to about 6 hours. In the temperature control period, the devitrification of the inner surface of the crucible is accelerated by supplying a voltage V2 higher than the voltage used for detecting touch at the silicon melt using the supporting shaft 12 as a positive electrode and the wire 18 as a negative electrode. Since alkali metal ions in the crucible are attracted toward the inner surface side and are concentrated near the inner surface of the crucible, the devitrification of the inner surface of the crucible can be accelerated to thereby form a uniform devitrified surface. At this time, the voltage level may be 30 V to 50 V. This is because if the voltage level is too low, alkali metal ions do not move, and thus uniform devitrification cannot be attained, whereas if the voltage level is too high, moving alkali metal ions may get out of the crucible and then dissolved into the silicon melt 21.

After the temperature control of the silicon melt 21 is completed by doing so, a pulling of the silicon single crystal starts (Step S16). In the pulling of the silicon single crystal 20 using the CZ method, the silicon single crystal 20 is grown at a lower end of the seed crystal by slowly pulling the seed crystal while rotating the supporting shaft 12 and the wire 18 in an opposite direction to each other. In detail, in order to obtain a dislocation-free single crystal, a seed narrowing (forming of a neck part or necking) by the Dash method is performed (Step S17). Next, in order to obtain a silicon single crystal with a desired diameter, a shoulder part is grown (Step S18). When the desired diameter of the silicon single crystal is reached, a body part with a constant diameter is grown (Step S19). After the body part is grown up to a predetermined length, a tail part narrowing (forming of a tail part) is performed (Step S20) in order to cut the dislocation-free single crystal from the silicon melt 21.

In the forming of the neck part, in order to eliminate a dislocation originally included in the seed crystal, or a slip dislocation generated in the seed crystal due to a thermal impact at the time of the touch at the silicon melt, the neck part is formed to have a minimum diameter of 3 mm to 5 mm by slowly pulling the seed crystal up while relatively rotating the seed crystal. When the length of the neck part reaches 10 mm to 20 mm and thus the slip dislocation is removed, the pulling rate of the seed crystal and the temperature of the silicon melt are controlled to increase the diameter of the neck part, thus performing the growth of the shoulder part.

When the diameter of the shoulder part reaches a desired diameter, the growth of the body part is performed. To increase wafer yield, it is required to maintain the diameter of the body part constant, and during the growth of the single crystal, output of the heater, pulling rate, elevation rate of the crucible and the like are controlled so that the body part can maintain a substantially constant diameter during growth. In particular, as the growth of the silicon single crystal is followed by a decrease of the silicon melt 21, resulting in a lowering of the surface level of the silicon melt 21, the crucible is raised to be corresponding to the lowering of the surface level of the silicon melt 21 in order to maintain the surface level of the silicon melt 21 at a constant height during the growth of the silicon single crystal, and thus the diameter of the single crystal is controlled to be constant during the growth of the silicon single crystal.

After the silicon single crystal is grown until the body part has a desired length, in order to prevent quality problems such as slip dislocation or abnormal oxygen precipitation from being generated when a thermal balance between the silicon melt and the silicon single crystal existing at a crystal growth interface is broken and an abrupt thermal impact is applied to the crystal, a conical tail part is formed by slowly reducing the diameter of the silicon single crystal, and then the silicon single crystal is separated from the silicon melt 21.

In the pulling of the silicon single crystal, the polarity of the voltage supplied between the supporting shaft 12 and the wire 18 is inverted differently from that in the above-described temperature control period, and thus a voltage V3 using the supporting shaft 12 as a negative electrode and the wire 18 as a positive electrode is supplied. By doing so, alkali metal ions in the silicon melt 21 are attracted toward the crucible side and are separated from the silicon single crystal which is being pulled, thereby capable of preventing the alkali metal impurity from being introduced into the silicon single crystal. Also, since alkali metal ions in the vitreous silica crucible 15 are attracted toward an outside and concentrated on the outer surface of the crucible, the devitrification of the outer surface of the crucible can be accelerated to thus form a uniformly devitrified surface even on the outer surface of the crucible. At this time, the voltage level may be slightly low, preferably 5 V to 30 V.

As the loss-by-melting of the inner surface of the crucible is progressed, the devitrified layer begins to disappear slowly. Therefore, before the devitrified layer of the inner surface of the crucible disappears, it is preferable that the devitrification is reaccelerated by returning to the voltage V2 using the supporting shaft 12 as a positive electrode and the wire 18 as a negative voltage. For example, when the loss-by-melting rate of the inner surface of the crucible is 5 μm/hr, an initial thickness of the devitrified layer is 100 μm, and a growth rate of the devitrified layer is 1 μm, the devitrified layer may disappear within about 24 hours. Therefore, the polarity of the voltage is converted to a voltage polarity using the crucible side as a positive electrode every 20 hours. By doing so, the devitrified surface can be reproduced, and the thickness of the devitrified layer can return to 500 μm. Accordingly, the durability of the crucible can be remarkably enhanced and, further, the improvement of the single crystallization can be expected. In particular, because a plurality of silicon single crystals are manufactured in the same crucible, the manufacturing method in accordance with the exemplary embodiments of the present invention is very advantageous in a multi-pulling method in which silicon raw material is additively filled in the crucible, or a continuous Czochralski method (CCZ method) in which a silicon single crystal is pulled while continuously supplying silicon raw material into the crucible.

Thereafter, the supply of the voltage is ended (Step S21), and the pulling process of the silicon single crystal is ended (Step S22). A silicon single crystal ingot separated from the silicon melt 21 is cooled under a predetermined condition, and silicon wafers cut from the silicon single crystal ingot are used as substrate material for a variety of semiconductor devices.

As described above, by the methods of manufacturing silicon single crystals in accordance with the exemplary embodiments, whether a seed crystal touches a silicon melt can be securely inspected by touching the seed crystal at the silicon melt while supplying a voltage using a crucible side as a negative electrode and a pulling shaft side as a positive electrode. Also, devitrification of an inner surface of the crucible can be performed during a temperature control period of the silicon melt by inverting the voltage polarity to supply a voltage using the crucible side as a positive electrode and the pulling shaft side as a negative electrode after the touch of the seed crystal at the silicon melt. Further, alkali metal ions in the silicon melt can be separated far from the silicon single crystal that is being pulled and alkali metal ions in the vitreous silica crucible may be concentrated near an outer surface of the crucible to thus accelerate the devitrification of the outer surface of the crucible by inverting the voltage polarity after the elapse of the temperature control period and supplying a DC voltage using the crucible side as a negative electrode and the pulling shaft side as a positive electrode.

Furthermore, in accordance with the exemplary embodiments, the voltage is always supplied, even though the polarity or level of the supply voltage is varied every process. Therefore, leakage of the silicon melt can be detected securely.

Moreover, in accordance with the exemplary embodiments, before a devitrified surface of the inner surface of the crucible disappears completely due to loss-by-melting of the inner surface of the crucible, the devitrified surface can be restored by supplying a voltage again using the crucible side as a positive electrode and the pulling shaft side as a negative electrode. Since the voltage supply can be periodically performed during the pulling of a silicon single crystal to maintain the devitrified surface, the durability of the crucible can be improved.

In the above, while the present invention has been particularly shown and described with reference to the exemplary embodiments, the present invention is not limited to the embodiments herein. Thus, various modifications are possible without departing from the purpose of the present invention, and may be included in the present invention.

For example, the exemplary embodiments illustrated that one terminal 24a of the power supply 24 is connected to the supporting shaft 12 and the other terminal 24b is connected to the wire 18; however, the present invention is not limited to such a configuration, but any configurations is allowed if it can supply a voltage between the vitreous silica crucible 14 and the wire 18. Also, the pulling shaft of the seed chuck 17 is not limited to the wire 18, but any pulling shaft having a rod shape may be used.

Also, the exemplary embodiments illustrated that a voltage is supplied until the growth of the tail part is completed; however, the voltage supply may be ended when the growth of the body part is completed.

As set forth above, in accordance with the previous embodiments, there can be provided a method of manufacturing a silicon single crystal, capable of monitoring leakage of silicon melt; detecting touch of a seed crystal at the silicon melt; and expecting reinforcement of a vitreous silica crucible to be endurable to pulling for a long time and decrease of the concentration of impurities contained in the silicon single crystal. Also, in accordance with the previous embodiments, an apparatus for pulling a silicon single crystal that can realize the above manufacturing method can be provided. Further, in accordance with the previous embodiments, in the method of manufacturing a silicon single crystal in which the silicon single crystal is pulled while a voltage is supplied to the crucible, impurity contamination of the silicon single crystals can be suppressed and the crucible can be reinforced.

What is claimed is:

1. A method of manufacturing a silicon single crystal comprising:
   detecting touching status of a seed crystal at silicon melt by supplying a first voltage using a vitreous silica crucible side as a negative electrode and a pulling shaft side as a positive electrode and by monitoring change of the first voltage, when the seed crystal provided at a front end of the pulling shaft touches the silicon melt inside a vitreous silica crucible;
   devitrifying an inner surface of the vitreous silica crucible as supplying a second voltage greater than the first voltage using the vitreous silica crucible side as a positive electrode and the pulling shaft side as a negative electrode during a temperature control period of the silicon melt, the temperature control period being a certain period after the touch of the seed crystal at the silicon melt; and
   growing a silicon single crystal by slowly pulling the seed crystal as supplying a third voltage smaller in absolute value than the second voltage using the vitreous silica crucible side as a negative electrode and the pulling shaft side as a positive electrode after the temperature control period.

2. The method of claim 1, wherein the growing of the silicon single crystal further comprises reproducing a devitrified portion of the inner surface of the vitreous silica crucible by supplying a fourth voltage greater in absolute value than a third voltage for a certain period before the devitrified portion formed at the inner surface of the vitreous silica crucible disappears.

3. The method of claim 2, wherein in the growing of the silicon single crystal, the supplying of the third voltage and the supplying of the fourth voltage are alternately repeated.

4. The method of claim 1, wherein leakage of the silicon melt is detected by monitoring changes of the first to third voltages.

5. The method of claim 1, wherein the vitreous silica crucible comprises one or at least two alkali metals selected from the group consisting of Na, K and Li, and a sum of concentrations of the alkali metals is equal to or greater than 0.05 ppm.

6. An apparatus for pulling a silicon single crystal, the apparatus comprising a pulling shaft, an elevator unit of the pulling shaft, a seed crystal provided at a front end of the pulling shaft, a vitreous silica crucible filled with silicon melt, a heater heating the silicon melt inside the vitreous silica crucible, a power supply supplying a voltage between the vitreous silica crucible and the pulling shaft, and a controller controlling the elevator unit, the heater and the power supply,
   wherein the controller comprises:
   a touch control part detecting touching status of the seed crystal at the silicon melt by supplying a first voltage using the vitreous silica crucible side as a negative electrode and the pulling shaft side as a positive electrode and by monitoring change of the first voltage, when the seed crystal touches the silicon melt by lowering the pulling shaft;
   a devitrification control part devitrifying an inner surface of the vitreous silica crucible as supplying a second voltage greater than the first voltage using the vitreous silica crucible side as a positive electrode and the pulling shaft side as a negative electrode during a temperature control period of the silicon melt, the temperature control period being a certain period after the touch of the seed crystal; and a single crystal control part growing a silicon single crystal by slowly pulling the seed crystal as supplying a third voltage smaller than the second voltage using the vitreous silica crucible side as a negative electrode and the pulling shaft side as a positive electrode after the temperature control period.

7. A vitreous silica crucible having a cylindrical sidewall part, a bottom part provided at a lower portion of the sidewall part, and a joining section provided between the sidewall part and the bottom part, the vitreous silica crucible being used for pulling a silicon single crystal in a state that a predetermined voltage is supplied with respect to a thickness direction of the crucible, the vitreous silica crucible comprising:
 a transparent vitreous silica layer provided on an inner surface of the crucible; and
 an opaque vitreous silica layer provided on an outer surface of the crucible, and including a plurality of bubbles,
 wherein the opaque vitreous silica layer comprises one or at least two alkali metals selected from the group consisting of Na, K and Li, and a sum of concentrations of the alkali metals is equal to or greater than 0.05 ppm.

8. The vitreous silica crucible of claim 7, wherein a sum of concentrations of the alkali metals comprised in the opaque vitreous silica layer is equal to or greater than 0.2 ppm.

9. The vitreous silica crucible of claim 7, wherein the transparent vitreous silica layer comprises one or at least two alkali metals selected from the group consisting of Na, K and Li, and a sum of concentrations of the alkali metals is equal to or greater than 0.05 ppm and equal to or less than 5 ppm.

10. The method of claim 2, wherein leakage of the silicon melt is detected by monitoring changes of the first to third voltages.

11. The method of claim 3, wherein leakage of the silicon melt is detected by monitoring changes of the first to third voltages.

12. The method of claim 2, wherein the vitreous silica crucible comprises one or at least two alkali metals selected from the group consisting of Na, K and Li, and a sum of concentrations of the alkali metals is equal to or greater than 0.05 ppm.

13. The method of claim 3, wherein the vitreous silica crucible comprises one or at least two alkali metals selected from the group consisting of Na, K and Li, and a sum of concentrations of the alkali metals is equal to or greater than 0.05 ppm.

14. The method of claim 4, wherein the vitreous silica crucible comprises one or at least two alkali metals selected from the group consisting of Na, K and Li, and a sum of concentrations of the alkali metals is equal to or greater than 0.05 ppm.

15. The method of claim 10, wherein the vitreous silica crucible comprises one or at least two alkali metals selected from the group consisting of Na, K and Li, and a sum of concentrations of the alkali metals is equal to or greater than 0.05 ppm.

16. The method of claim 11, wherein the vitreous silica crucible comprises one or at least two alkali metals selected from the group consisting of Na, K and Li, and a sum of concentrations of the alkali metals is equal to or greater than 0.05 ppm.

17. The vitreous silica crucible of claim 8, wherein the transparent vitreous silica layer comprises one or at least two alkali metals selected from the group consisting of Na, K and Li, and a sum of concentrations of the alkali metals is equal to or greater than 0.05 ppm and equal to or less than 5 ppm.

* * * * *